US006997743B1

(12) United States Patent
Su et al.

(10) Patent No.: US 6,997,743 B1
(45) Date of Patent: Feb. 14, 2006

(54) CARD-SECURING DEVICE FOR SECURING A CARD TO A MAIN PRINTED CIRCUIT BOARD

(75) Inventors: Fei-Ming Su, Chang-Hua Hsien (TW); Eng-Guang Huang, Chang-Hua Hsien (TW); Jen-Yu Lee, Nan-Tou Hsien (TW)

(73) Assignee: Universal Scientific Industrial Co., Ltd., (TW)

( * ) Notice: Subject to any disclaimer, the term of this patent is extended or adjusted under 35 U.S.C. 154(b) by 0 days.

(21) Appl. No.: 10/970,141

(22) Filed: Oct. 21, 2004

(51) Int. Cl.
*H01R 13/60* (2006.01)
(52) U.S. Cl. .................... 439/567; 439/607; 439/159; 439/630
(58) Field of Classification Search ........ 439/629–630, 439/159, 607–609, 567; 361/816; 174/51
See application file for complete search history.

(56) References Cited

U.S. PATENT DOCUMENTS 6,186,800 B1 * 2/2001 Klein et al. .................... 439/95
6,394,843 B1 * 5/2002 Chang et al. ............... 439/607

\* cited by examiner

*Primary Examiner*—Truc Nguyen
(74) *Attorney, Agent, or Firm*—Ostrolenk, Faber, Gerb & Soffen, LLP

(57) ABSTRACT

A card-securing device has a plate body for securing a card to a printed circuit board. The plate body includes a main plate, and a pair of side-securing plates and an end-securing plate which extend transversely from the main plate. Each of the side-securing plates and the end-securing plate has a base portion connected to the main plate, a neck portion extending and reduced in length from the corresponding base portion, and a tab portion bent and extending from the corresponding neck portion through the printed circuit board to anchor on a bottom surface of the printed circuit board.

16 Claims, 5 Drawing Sheets

CARD-SECURING DEVICE FOR SECURING A CARD TO A MAIN PRINTED CIRCUIT BOARD

BACKGROUND OF THE INVENTION

1. Field of the Invention

This invention relates to a card-securing device for securing a card to a main printed circuit board.

2. Description of the Related Art

FIG. 1 illustrates a conventional electronic assembly having a card 2 secured to a printed circuit board 1 through screw means 3. The card 2 has an edge connector (not shown) that is inserted into an expansion slot 10 in the printed circuit board 1 for connecting electrically to the printed circuit board 1. The screw means 3 are disposed at one side of the card 2 that is opposite to the expansion slot 10. As such, the edge connector of the card 2 has a tendency to move out of the expansion slot 10 and to be disconnected from the printed circuit board 1 when said one side of the card 2 is pressed downwardly upon tightening of the screw means 3. Particularly, the aforesaid disconnection problem is likely to happen when the screw means 3 are excessively tightened. In addition, the total area of the printed circuit board 1 occupied by the screw means 3 is relatively large, which has an adverse effect on the circuit layout of the printed circuit board 1.

SUMMARY OF THE INVENTION

Therefore, the object of this invention is to provide a card-securing device that is capable of overcoming the aforesaid drawbacks of the prior art.

According to the present invention, a card-securing device for securing a card to a main printed circuit board is provided. The card-securing device comprises a plate body that includes: a main plate adapted to be disposed on the card and having opposite first and second ends and opposite first and second sides extending between the first and second ends; a pair of side-securing plates disposed adjacent to the first end of the main plate, each of the side-securing plates being adapted to extend through the main printed circuit board and having a base portion that extends downwardly from a respective one of the first and second sides of the main plate and that is adapted to be disposed on an upper surface of the main printed circuit board, and a tab portion that is adapted to be disposed below the main printed circuit board and that is bendable to a folded state in which the tab portion is adapted to anchor on a bottom surface of the main printed circuit board; and an end-securing plate adapted to extend through the main printed circuit board and having a base portion that extends downwardly from the second end of the main plate and that is adapted to be disposed on the upper surface of the main printed circuit board, and a tab portion that is adapted to be disposed below the main printed circuit board and that is bendable to a folded state in which the tab portion of the end-securing plate is adapted to anchor on the bottom surface of the main printed circuit board.

BRIEF DESCRIPTION OF THE DRAWINGS

Other features and advantages of the present invention will become apparent in the following detailed description of the preferred embodiment of the invention, with reference to the accompanying drawings. In the drawings.

DETAILED DESCRIPTION OF THE PREFERRED EMBODIMENT

Figure 1:
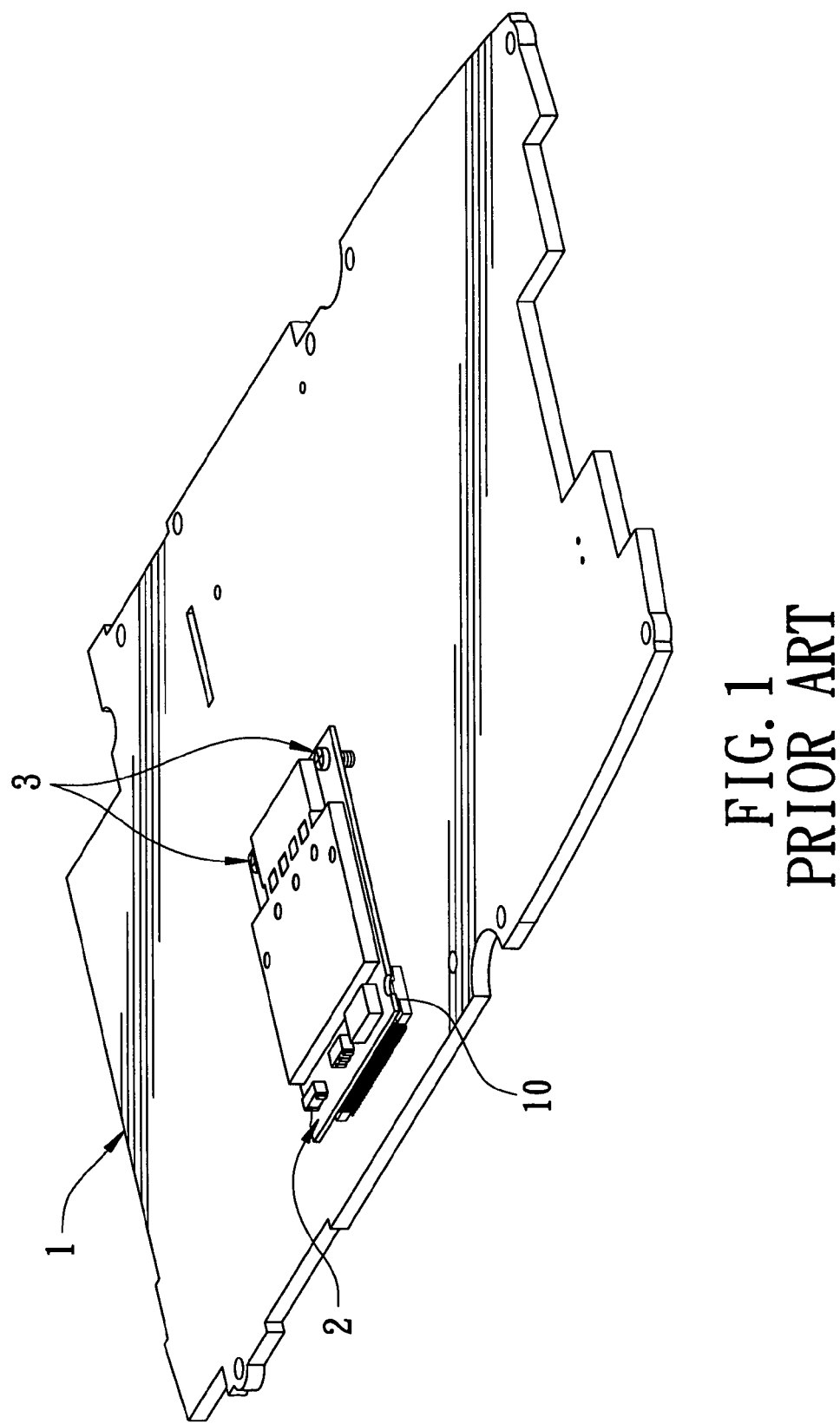
FIG. 1 is a perspective view of a conventional electronic assembly having a card secured to a printed circuit board through screw means.

FIGS. 2 to 5 illustrate the preferred embodiment of an electronic assembly according to this invention.

The electronic assembly includes: a main printed circuit board 4 having a top surface 41, a bottom surface 42 (see FIGS. 4 and 5), and an expansion slot 43, and formed with a pair of opposite first slits 44 that are disposed adjacent to the expansion slot 43, and a second slit 46 that is opposite to the expansion slot 43; a card 5 having an expansion printed circuit board 52 that is disposed above the main printed circuit board 4 among the first and second slits 44, 46, a plurality of components 53 mounted on the expansion printed circuit board 52, and an edge connector 51 that is inserted into the expansion slot 43; and a card-securing device 6 having a plate body 7.

The plate body 7 includes: a main plate 72 disposed on the card 5 and having opposite first and second ends 721, 722 and opposite first and second sides 723 extending between the first and second ends 721, 722; a pair of side-securing plates 8 disposed adjacent to the first end 721 of the main plate 72, each of the side-securing plates 8 having a base portion 81 that extends downwardly from a respective one of the first and second sides 723 of the main plate 72 and that is disposed on the upper surface 41 of the main printed circuit board 4, a neck portion 82 that extends downwardly and that is reduced in length from the base portion 81 and that extends through a respective one of the first slits 44 in the main printed circuit board 4, and a tab portion 83 that extends downwardly from the neck portion 82 and that is bendable to a folded state to anchor on the bottom surface 42 of the main printed circuit board 4; and an end-securing plate 8' having a base portion 81' that extends downwardly from the second end 722 of the main plate 72 and that is disposed on the upper surface 41 of the main printed circuit board 4, a neck portion 82' that extends downwardly and that is reduced in length from the base portion 81' (see FIG. 4) and that extends through the second slit 46 in the main printed circuit board 4, and a tab portion 83' that extends downwardly from the neck portion 82' and that anchors on the bottom surface 42 of the main printed circuit board 4.

Preferably, the plate body 7 is a single piece that is stamped from a metal plate. Each of the side-securing plates 8 and the end-securing plate 8' is bent from the main plate 72.

In this embodiment, the tab portion 83 (83') of each of the side-securing plates 8 and the end-securing plate 8' is enlarged in length from and cooperates with the neck portion 82 (82') of the respective one of the side-securing plates 8 and the end-securing plate 8' to form an L-shaped structure, and has a first segment 831 (see FIG. 4) that extends downwardly from the neck portion 82 (82'), and a second segment 832 that extends transversely from the first segment 831 and that is bent from the first segment 831 so as to anchor on the bottom surface 42 of the main printed circuit board 4.

Figure 2:
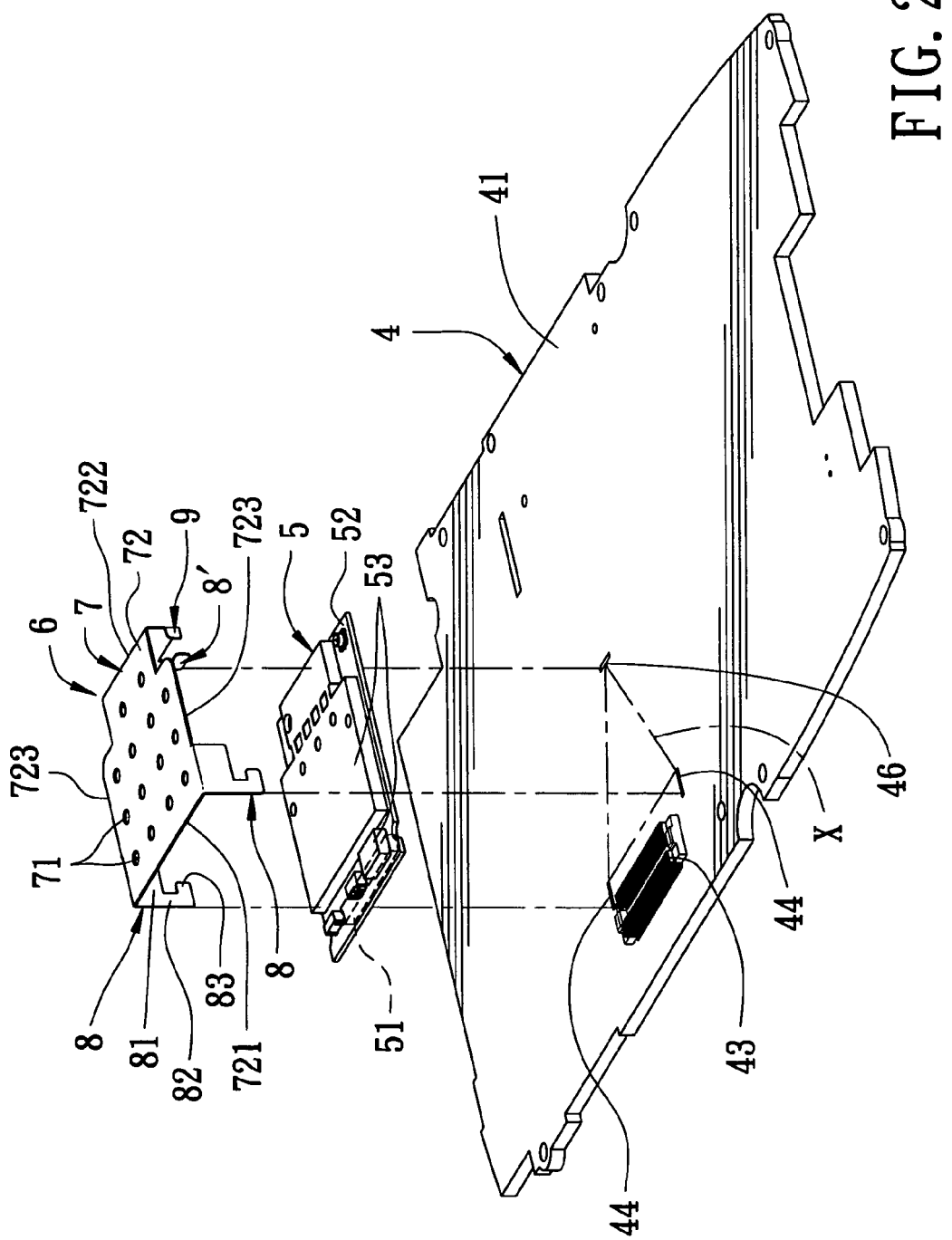
FIG. 2 is an exploded perspective view of the preferred embodiment of an electronic assembly according to this invention.
Figure 3:
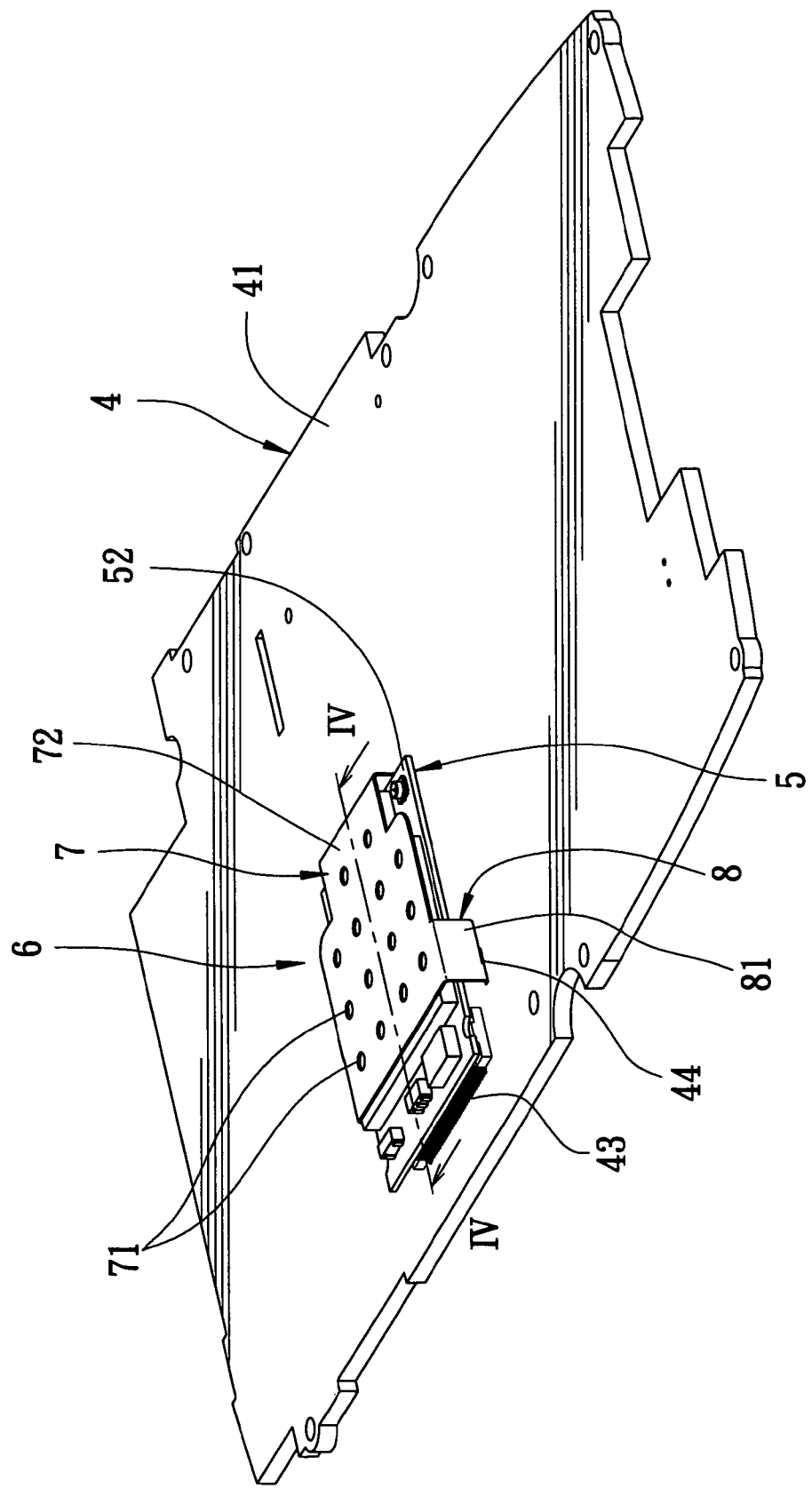
FIG. 3 is a perspective view of the preferred embodiment.
Figure 4:
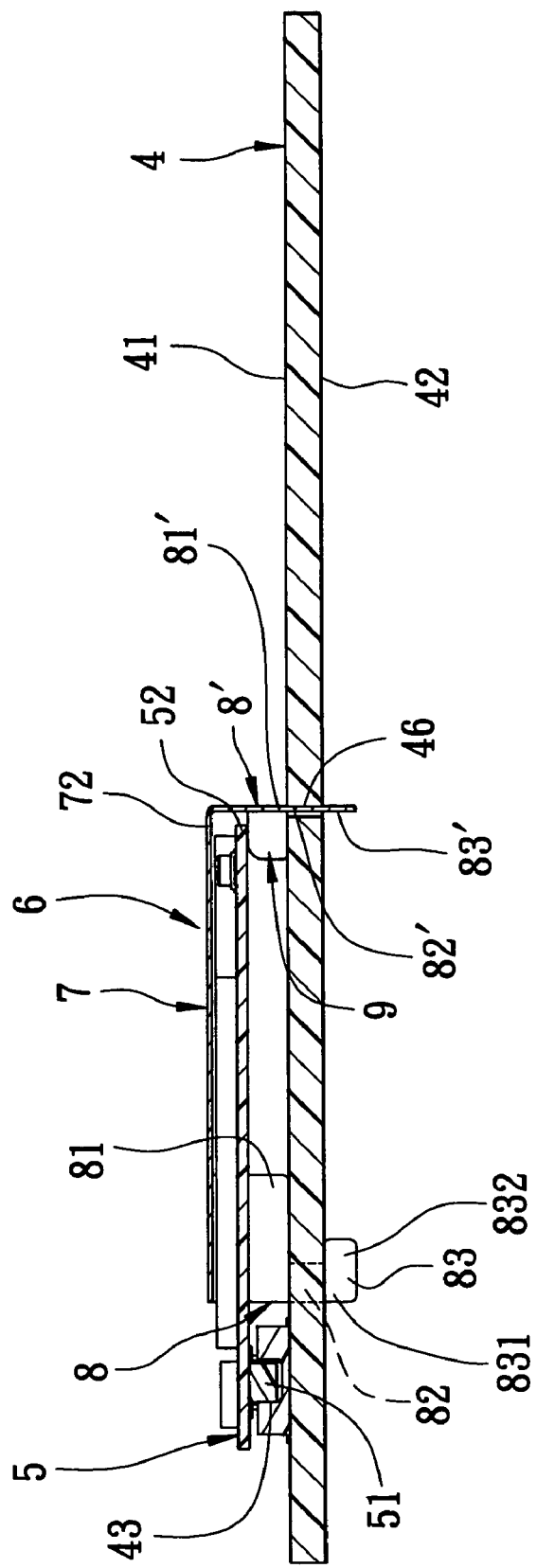
FIG. 4 is a sectional view taken along the lines IV—IV in FIG. 3.
Figure 5:
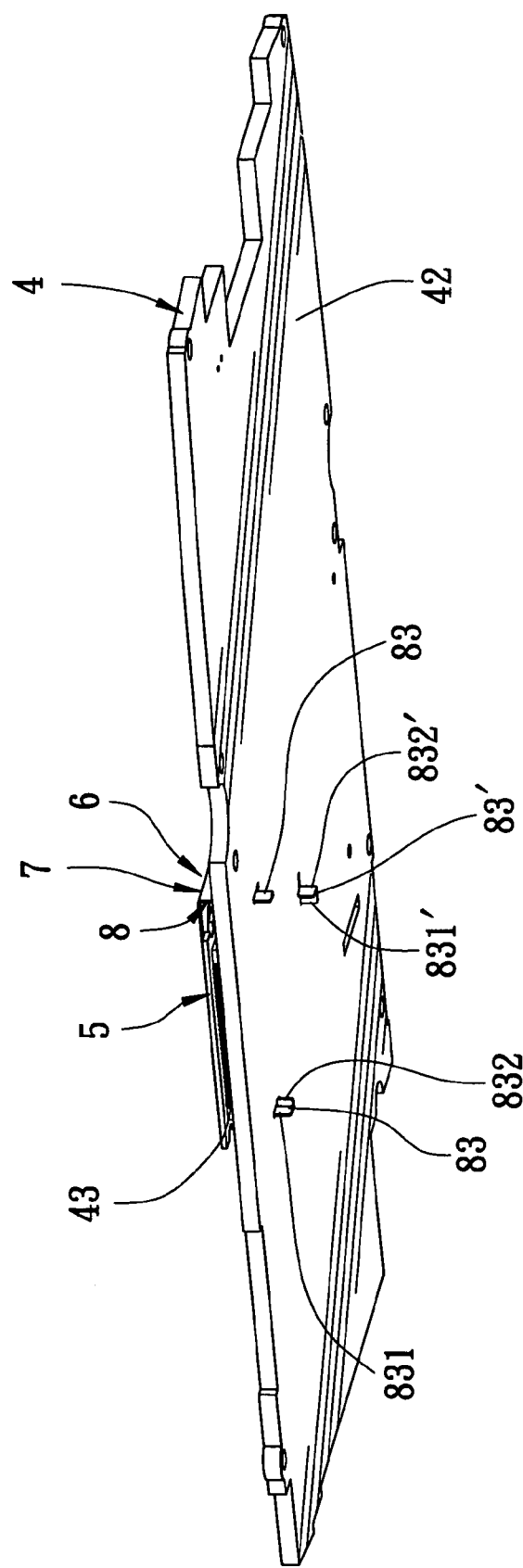
FIG. 5 is a bottom perspective view of the preferred embodiment.

The tab portions 83 (83') of the side-securing plates 8 and the end-securing plate 8' are disposed in a relation such that the tab portions 83 (83') are respectively located at vertices of an isosceles triangle (indicated as X in FIG. 2).

The base portion 81' of the end-securing plate 8' has two opposite sides, and is formed with two opposite side tabs 9 that extend respectively and transversely from the sides of the base portion 81' of the end-securing plate 8' and that are disposed on the upper surface 41 of the main printed circuit board 4. Each of the side tabs 9 extends in a direction toward the first end 721 of the main plate 72. The expansion printed circuit board 52 is seated on the side tabs 9.

Preferably, the main plate 72 is formed with a plurality of holes 71 for dissipating heat generated by the card 5.

With the inclusion of the card-securing device 6 in the electronic assembly of this invention, the card 5 can be secured to the main printed circuit board 4 through the card-securing device 6, and the aforesaid drawbacks associated with the prior art can be eliminated.

While the present invention has been described in connection with what is considered the most practical and preferred embodiment, it is understood that this invention is not limited to the disclosed embodiment but is intended to cover various arrangements included within the spirit and scope of the broadest interpretations and equivalent arrangements.

We claim:

1. A card-securing device for securing a card to a main printed circuit board, comprising:
   a plate body including
      a main plate adapted to be disposed on the card and having opposite first and second ends and opposite first and second sides extending between said first and second ends,
      a pair of side-securing plates disposed adjacent to said first end of said main plate, each of said side-securing plates being adapted to extend through the main printed circuit board and having a base portion that extends downwardly from a respective one of said first and second sides of said main plate and that is adapted to be disposed on an upper surface of the main printed circuit board, and having a tab portion that is adapted to be disposed below the main printed circuit board and that is bendable to a folded state in which said tab portion is adapted to anchor on a bottom surface of the main printed circuit board, and
      an end-securing plate adapted to extend through the main printed circuit board and having a base portion that extends downwardly from said second end of said main plate and that is adapted to be disposed on the upper surface of the main printed circuit board, and having a tab portion that is adapted to be disposed below the main printed circuit board and that is bendable to a folded state in which said tab portion of said end-securing plate is adapted to anchor on the bottom surface of the main printed circuit board;
   wherein said base portion of said end-securing plate has two opposite sides, and is formed with two opposite side tabs, each of said two opposite side tabs extending from a respective one of said opposite sides of said base portion of said end-securing plate in a direction toward said first end of said main plate in a manner structured to support an end of the card thereon.

2. The card-securing device of claim 1, wherein each of said side-securing plates further has a neck portion that extends downwardly and that is reduced in length from said base portion and that is adapted to extend through the main printed circuit board, said tab portion of each of said side-securing plates extending downwardly from said neck portion.

3. The card-securing device of claim 1, wherein said end-securing plate further has a neck portion that extends downwardly and that is reduced in length from said base portion of said end-securing plate and that is adapted to extend through the main printed circuit board, said tab portion of said end-securing plate extending downwardly from said neck portion.

4. The card-securing device of claim 1, wherein said tab portions of said side-securing plates and said end-securing plate are disposed in a relation such that said tab portions are respectively located at vertices of an isosceles triangle.

5. The card-securing device of claim 1, wherein said plate body is a single piece that is stamped from a metal plate, each of said side-securing plates and said end-securing plate being bent from said main plate.

6. The card-securing device of claim 1, wherein said main plate is formed with a plurality of holes.

7. The card-securing device of claim 2, wherein said tab portion of each of said side-securing plates is enlarged in length from and cooperates with said neck portion of the respective one of said side-securing plates to form an L-shaped structure, and has a first segment that extends downwardly from said neck portion, and a second segment that extends transversely from said first segment and that is bendable from said first segment.

8. The card-securing device of claim 3, wherein said tab portion of said end-securing plate is enlarged in length from and cooperates with said neck portion of said end-securing plate to form an L-shaped structure, and has a first segment that extends downwardly from said neck portion, and a second segment that extends transversely from said first segment and that is bendable from said first segment.

9. An electronic assembly comprising:
   a main printed circuit board having an upper surface, a bottom surface, and an expansion slot, and formed with a pair of opposite first slits that are disposed adjacent to said expansion slot, and a second slit that is opposite to said expansion slot;
   a card disposed above said main printed circuit board among said first and second slits, and having an edge connector that is inserted into said expansion slot; and
   a card-securing device having a plate body that includes
      a main plate disposed on said card having opposite first and second ends,
      a pair of opposite side-securing plates extending downwardly from said main plate through said first slits in said main printed circuit board, respectively, and anchoring on said bottom surface of said main printed circuit board, and
      an end-securing plate extending downwardly from said main plate through said second slit in said main printed circuit board and anchoring on said bottom surface of said main printed circuit board, said end-securing plate having a base portion extending downwardly from said second end of said main plate;
   wherein said base portion of said end-securing plate is formed with at least one side tab structured to support an end of said card, which is opposite to said edge connector, thereon.

10. The electronic assembly of claim 9, wherein said main plate has opposite first and second sides extending between said first and second ends, each of said side-securing plates being disposed adjacent to said first end of said main plate and each of said side-securing plates further having a base portion that extends downwardly from a respective one of said first and second sides of said main plate, having a neck portion that extends downwardly and that is reduced in length from said base portion through a respective one of said first slits in said main printed circuit board, and having a tab portion that extends downwardly from said neck portion and that is bendable to a folded state in which said tab portion anchors on said bottom surface of said main printed circuit board.

11. The electronic assembly of claim 9, wherein said plate body is a single piece that is stamped from a metal plate, each of said side-securing plates and said end-securing plate being bent from said main plate.

12. The electronic assembly of claim 9, wherein said main plate is formed with a plurality of holes.

13. The electronic assembly of claim 10, wherein said at least one side tab of said base portion of said end-securing plate extends in a direction toward said first end of said main plate, said end-securing plate further having a neck portion that extends downwardly and that is reduced in length from said base portion of said end-securing plate through said second slit in said main printed circuit board, and having a tab portion that extends downwardly from said neck portion of said end-securing plate and that is bendable to a folded state in which said tab portion anchors on said bottom surface of said main printed circuit board.

14. The electronic assembly of claim 10, wherein said tab portion of each of said side-securing plates is enlarged in length from and cooperates with said neck portion of the respective one of said side-securing plates to form an L-shaped structure, and has a first segment that extends downwardly from said neck portion, and a second segment that is bent and that extends transversely from said first segment.

15. The electronic assembly of claim 13, wherein said tab portion of said end-securing plate is enlarged in length from and cooperates with said neck portion of said end-securing plate to form an L-shaped structure, and has a first segment that extends downwardly from said neck portion, and a second segment that is bent and that extends transversely from said first segment.

16. The electronic assembly of claim 13, wherein said tab portions of said side-securing plates and said end-securing plate are disposed in a relation such that said tab portions are respectively located at vertices of an isosceles triangle.

\* \* \* \* \*